United States Patent [19]

Shiohara

[11] Patent Number: 5,027,019
[45] Date of Patent: Jun. 25, 1991

[54] ANALOG SWITCH CIRCUIT WITH REDUCED SWITCHING NOISE

[75] Inventor: Hiroshi Shiohara, Yokohama, Japan

[73] Assignee: Kabushiki Kaisha Toshiba, Kawasaki, Japan

[21] Appl. No.: 95,265

[22] Filed: Sep. 11, 1987

[30] Foreign Application Priority Data

Sep. 26, 1986 [JP] Japan .................. 61-226223

[51] Int. Cl.⁵ ................................ H03K 17/687
[52] U.S. Cl. .................... 307/579; 307/585; 328/152; 328/127; 328/116
[58] Field of Search ........ 307/579, 576, 585, 451–452, 307/572, 542, 279; 377/114, 106, 105, 117, 121, 125, 127; 328/152, 127, 109, 116

[56] References Cited

U.S. PATENT DOCUMENTS

| | | | |
|---|---|---|---|
| 2,899,567 | 8/1959 | Romano | 328/152 |
| 3,739,199 | 6/1973 | Negrou | 377/114 |
| 3,866,131 | 2/1975 | Figueroa | 328/152 |
| 3,943,378 | 3/1976 | Beutler | 377/117 |
| 4,230,951 | 10/1980 | Suzuki et al. | 377/105 |
| 4,420,695 | 12/1983 | Dingwall et al. | 328/152 |
| 4,507,649 | 7/1988 | Lewis | 377/121 |
| 4,764,752 | 8/1988 | Ormond | 328/127 |

Primary Examiner—Stanley D. Miller
Assistant Examiner—T. Cunningham
Attorney, Agent, or Firm—Foley & Lardner

[57] ABSTRACT

In the conventional analog switch circuit, an integrating circuit is connected to each gate terminal of a number of analog switches to reduce the switching speed and thus to reduce switching noise. Therefore, when the analog switch circuit is formed into a single IC chip, an area where resistances and capacitances are to be formed is relatively large. To overcome this problem, only two integrating circuits are provided and two integrated switching signals are selectively applied to gate terminals of the analog switches via switches under control of a control circuit, thus realizing an ICed analog switch circuit, while reducing differences in time constant among the analog switches and thus switching noise.

5 Claims, 4 Drawing Sheets

ANALOG SWITCH CIRCUIT WITH REDUCED SWITCHING NOISE

BACKGROUND OF THE INVENTION

1. Field of the Invention

The present invention relates to an analog switch circuit for activating a number of analog switches made up of semiconductor switching elements.

2. Description of the Prior Art

Conventional analog switches can roughly be classified into two groups mechanical and semiconductor. The mechanical switches are reed relay switches, while the semiconductor switches are insulated gate field effect transistors (referred to as FETs simply, hereinafter). However, FETs are more suitable for use as an analog switch because no gate current flows through the gate thereof without producing a dc offset.

In the above-mentioned FET analog switch mode up of FETs, when a high speed switching signal is directly applied to the gate of an FET to turn it on, since current changes at high speed between the source and the drain thereof, there exists a problem in that impulse switching noise will be generated whenever the analog switch is turned on or off.

Therefore, where a analog switch circuit turned on or off in response to high-speed switching signals is incorporated in an audio appliance, there arises a problem in that generated switching noise exerts a harmful influence upon the audio appliance and therefore the quality of the audio appliance will be degraded. In addition, in case the generated switching noise level is extraordinarily high, there exists a danger such that a speaker provided for an audio appliance may be damaged.

To overcome the above-mentioned problem, the analog switch circuit is usually configured in such a way that switching signals are not directly applied to the gates of FETs.

FIG. 1 shows an example of prior-art analog switch circuits which can reduce switching noise. This prior-art analog switch circuit includes two analog switches 5 each made up of a pair of parallel-connected P-channel FET (referred to as PFET) and N-channel FET (referred to as NFET) with source and drain terminals of two FETs connected to each other. Further, an integrating circuit 7 composed of a resistor R and a capacitor C is connected to each gate terminal of both the PFET 1 and NFET 3, respectively.

Therefore, each analog switch 5 is turned on or off in response to two switching signals outputted from two integrating circuits 7 on the basis of a control signal applied through the control circuit 9. That is, the analog switches 5 are turned on or off in response to two switching signals having gentle leading and trailing edges, so that the PFET 1 and the NFET 3 are both turned on or off at relatively low switching speed, thus reducing change rate per unit time of drain currents passed through the PFET 1 and NFET 3 whenever these FETs 1 and 3 are turned on or off, in order to suppress the generation of switching noise.

In the above-mentioned prior art analog switch circuit, however, since an integrating circuit is connected to each gate terminal of each FET which configures an analog switch and further the resistance or the capacitance of the integrating circuit each occupies a relatively large area, where the analog switch circuit including integrating circuits is formed into an IC circuit, there exists a problem in that a relatively large area is necessary to form these resistances and capacitors. In particular, in the case of an electronic variable resistor circuit, for instance which requires a great number of analog switches, the above-mentioned problem is serious.

In addition, where a great number of integrating circuits are formed to reduce noise, since there inevitably exist differences in resistance and capacitance between the integrating circuits, and therefore differences in time constant therebetween, another problem will occur such that switching noise generation cannot be prevented perfectly.

SUMMARY OF THE INVENTION

With these problems in mind, therefore, it is the primary object of the present invention to provide an analog switch circuit which can reduce switching noise while enabling an integrated analog switch circuit configuration.

To achieve the above-mentioned object, an analog switch circuit according to the present invention comprises: (a) a plurality of analog switching means for transmitting signals; (b) first integrating means for generating an integrated turn-on switching signal to turn on said analog switching means at relatively low switching speed; (c) second integrating means for generating an integrated turn-off switching signal to turn off said analog switching means at relatively low switching speed; (d) a plurality of switching means connected between said analog switching means and said two integrating means, respectively; and (e) control means for simultaneously activating said first or second integrating means and said switching means in such a way that the integrated turn-on or turn-off switching signal is selectively applied to said analog switching means via said activated switching means to turn or off said analog switching means and for generating a turn-on or turn-off signal to said analog switching means via said switching means to hold said analog switching means already turned on or off in response to the turn-on or -off switching signal.

The feature of the analog switch circuit of the present invention is to selectively supply a first (high-voltage level) switching signal generated from a first integrating circuit and a second (low-voltage level) switching signal generated from a second integrating circuit to a great number of analog switches made up of two, P-type and N-type, semiconductor switching elements via switches controlled by a control circuit. Since only two resistors and capacitors are required for the integrating circuits, it is possible to reduce the area required for the in which integrating circuits and also dispersion in time constant of the integrators.

BRIEF DESCRIPTION OF THE DRAWINGS

The features and advantages of the analog switch circuit according to the present invention will be more clearly appreciated from the following description of the preferred embodiments of the invention taken in conjunction with the accompanying drawings in which like reference numerals designate the same or similar elements or sections throughout the figures thereof and in which.

DETAILED DESCRIPTION OF THE PREFERRED EMBODIMENTS

Figure 1:
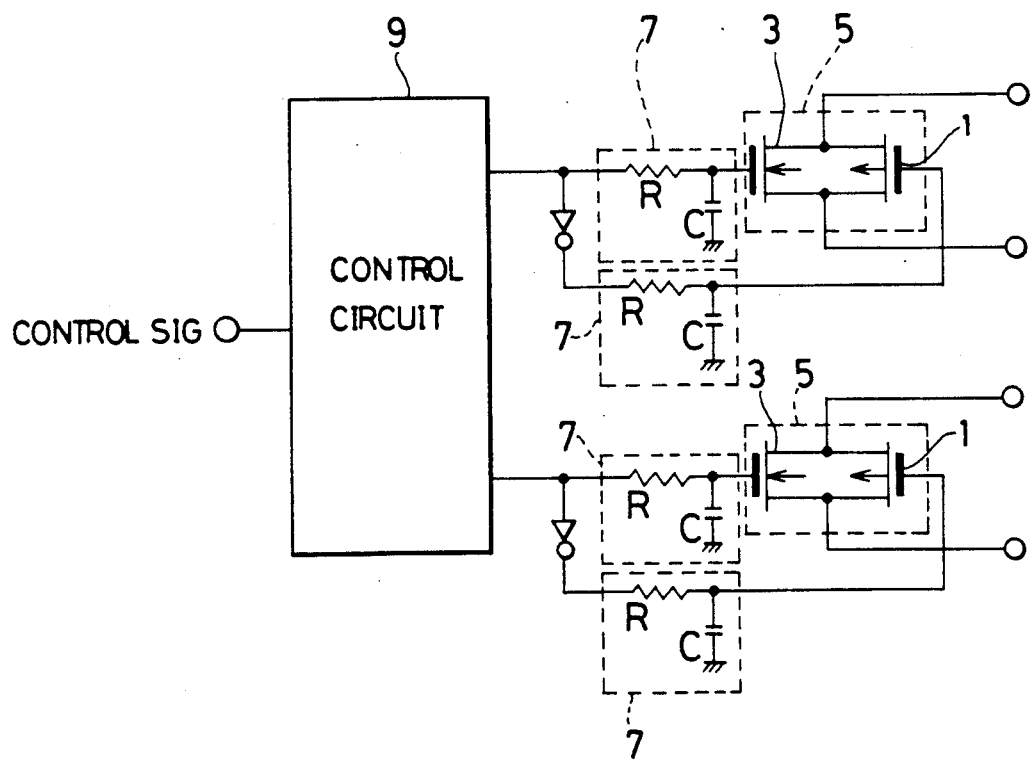
FIG. 1 is a circuit diagram showing an example of prior-art analog switch circuits.
Figure 2:
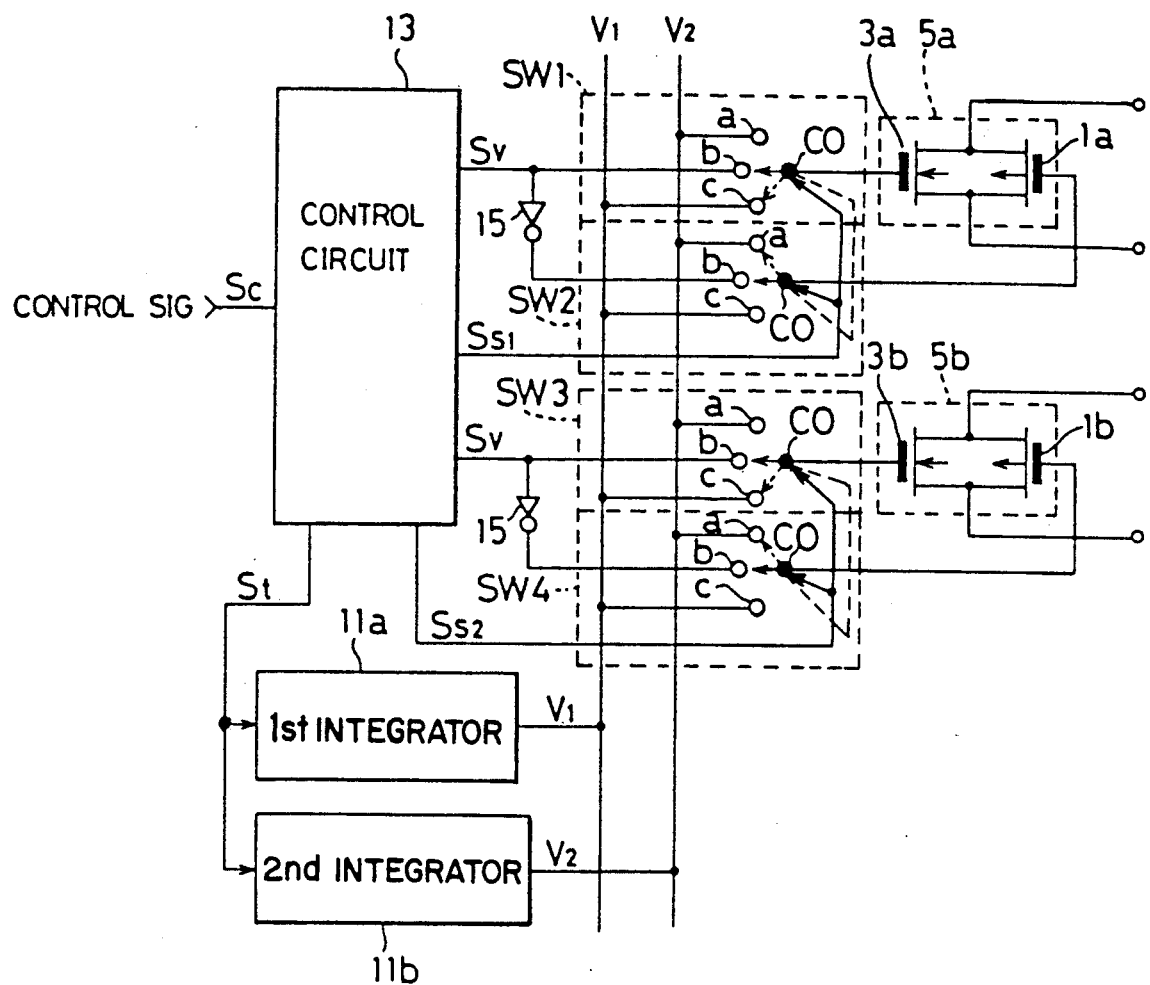
FIG. 2 is a circuit diagram showing a first embodiment of the analog switch circuit according to the present invention.

The embodiment of the present invention will be described with reference to the attached drawings. FIG. 2 shows a first embodiment thereof.

The analog switch circuit shown in FIG. 2 comprises two analog switches $5a$ and $5b$ each composed of a PFET (P-channel field effect transistor) 1 and NFET (N-channel field effect transistor) 3; two first and second integrated signal generators $11a$ and $11b$ for generating two integrated switching signals $V_1$ and $V_2$ to turn on or off the PFET 1 and NFET 3; four switches SW1, SW2, SW3 and SW4 for selectively supplying the two integrated switching signals $V_1$ and $V_2$ to the PFET 1 and NFET 3 of each analog switch $5a$ or $5b$; and a control circuit 13 for selectively activating the first integrator signal generator $11a$, the second integrator signal generator $11b$, and four switches SW1 to SW4, respectively.

In the analog switch circuit shown in FIG. 2, the two analog switches $5a$ and $5b$ are activated (turned on) or deactivated (turned off) in response to two switching signals $V_1$ and $V_2$ generated by the two integrated signal generators $11a$ and $11b$ and selectively passed through the four switches SW1 to SW4.

In more detail, each analog switch $5a$ or $5b$ is composed of the PFET 1 and the NFET 3, and the source terminal and the drain terminal of these two PFET 1 and NFET 3 are connected to each other. The gate terminal of the NFET $3a$ of the analog switch $5a$ is connected to a common contact CO of the first switch SW1; the gate terminal of the PFET $1a$ of the analog switch $5a$ is connected to a common contact CO of the second switch SW2; the gate terminal of the NFET $3b$ of the analog switch $5b$ is connected to a common contact CO of the third switch SW3; and the gate terminal of the PFET $1b$ of the analog switch $5b$ is connected to a common contact CO of the fourth switch SW4.

Figure 3:
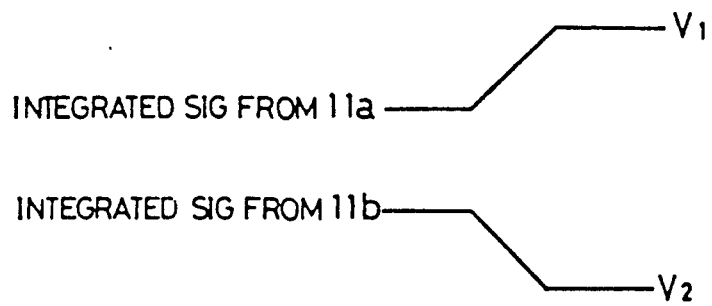
FIG. 3 is a waveform diagram for assistance in explaining switching signals for activating or deactivating the analog switches shown in FIG. 2.

The first integrated signal generator $11a$ generates a first switching signal $V_1$ having a gentle leading edge as shown in FIG. 3 in response to a control signal supplied from the control circuit 13. The second integrated signal generator $11b$ generates a second switching signal $V_2$ having a gentle trailing edge also as shown in FIG. 3 in response to a control signal supplied from the control circuit 13.

The first integrated signal $V_1$ is applied to four contacts c of SW1, SW2, SW3 and SW4, simultaneously. The second integrated signal $V_2$ is applied to four contacts a of SW1, SW2, SW3 and SW4, simultaneously.

Further, two contacts b of SW1 and SW3 are directly connected to the control circuit 13. Two contacts b of SW2 and SW4 are connected to the control circuit 13 via an inverter 15.

In response to a control signal Sc, the control circuit 13 supplies a trigger signal St to the first and second integrators $11a$ and $11b$ and simultaneously two switch selecting signals $S_{S1}$ and $S_{S2}$ to the switches SW1 to SW4 to change-over these four switches SW1 to SW4.

In addition the control circuit 13 supplies two voltage signals Sv (whose voltage level is equal to that of the integrated signal $V_1$ or $V_2$) to the gate terminals of the PFETs $1a$ and $1b$ and the NFETs $3a$ and $3b$ of the analog switches $5a$ and $5b$ via contacts b of these switches SW1 to SW4.

The operation of the analog switch circuit shown in FIG. 2 will be described hereinbelow:

(a) When switches $5a$ and $5b$ are both turned on:

When a control signal Sc is applied to the control circuit 13, the control circuit 13 outputs two switch selecting signals $S_{S1}$ and $S_{S2}$ to change over the switches SW1 to SW4 in such a way that the common contact CO is connected to c in switches SW1 and SW3 and to a in switches SW2 and SW4, as shown by dashed lines in FIG. 2.

Further, since a trigger signal St is applied from the control circuit 13 to the first and second integrators $11a$ and $11b$, a first switching signal $V_1$ of a gentle leading edge is applied to the gate terminals of the NFETs $3a$ and $3b$ of the analog switches $5a$ and $5b$ via switches SW1 and SW3.

Further, a second switching signal $V_2$ of gentle trailing edge is applied to the gate terminals of the PFETs $1a$ and $1b$ of the analog switches $5a$ and $5b$ via switches SW2 and SW4.

Therefore, the two analog switches $5a$ and $5b$ (PFETs $1a$ and $1b$ and NFETs $3a$ and $3b$) are both turned on to transmit signals through the analog switches $5a$ and $5b$.

As described above, once the PFETs $1a$ and $1b$ and NFETs $3a$ and $3b$ of the analog switches $5a$ and $5b$ are turned on, the switches SW1 to SW4 are all changed over in such a way that all the common contacts CO are connected to the contacts b as shown by solid lines in FIG. 2, so that a high-voltage level signal is directly supplied from the control circuit 13 to the gate terminals of the NFETs $3a$ and $3b$ and a low-voltage level signal is supplied to those of the PFETs $1a$ and $1b$ via inverters 15 in order to keep these two analog switches $5a$ and $5b$ already turned on.

(b) When switches $5a$ and $5b$ are both turned off:

When a control signal Sc is supplied to the control circuit 13 under the condition that the two analog switches $5a$ and $5b$ are on, each common contact CO is connected from b to a in SW1 and SW3 and to c in switches SW2 and SW4.

Further, in the same way as when turned on, since a trigger signal St is applied from the control circuit 13 to the first and second integrated signal generators $11a$ and $11b$, a first switching signal $V_1$ of a gentle leading edge is applied to the gate terminals of the PFETs $1a$ and $1b$ of the analog switches $5a$ and $5b$ via switches SW2 and SW4.

Further, a second switching signal $V_2$ of a gentle trailing edge is supplied to the gate terminals of the NFETs $3a$ and $3b$ of the analog switches $5a$ and $5b$ via switches SW1 and SW3.

Therefore, the two analog switches $5a$ and $5b$ (PFETs $1a$ and $1b$ and NFETs $3a$ and $3b$) are both turned off to interrupt signals through the analog switches $5a$ and $5b$.

Once the PFETs 1a and 1b and NFETs 3a and 3b of the analog switches 5a and 5b are turned off, the switches SW1 to SW4 are all changed over in such a way that all the common contacts CO are connected to the contacts b in all the switches SW1 and SW4, so that a low-voltage level signal Sv is directly supplied from the control circuit 13 to the gate terminals of the NFETs 3a and 3b and a high-voltage level signal is supplied to those of the PFETs 1a and 1b via the inverters 15 in order to keep these two analog switches 5a and 5b turned off.

In the above first embodiment, two analog switches 5a and 5b are simultaneously turned on or off. However, it is also possible to switch any one of these two analog switches 5a and 5b, independently. In this case, the common contacts CO of two of four switches SW1 to SW4 connected to the analog switch 5a or 5b to be kept unswitched are kept connected to contacts b.

Further, in the above embodiment, it is of course possible to switch a great number of analog switches simultaneously, without being limited to the number of analog switches.

As described above, in the first embodiment of the present invention, since a number of analog switches can be turned on or off in response to two switching signals $V_1$ and $V_2$ generated from only two integrated signal generators 11a and 11b, the number of resistances and capacitors for forming two integrating circuits can be reduced down to two, irrespective of the number of the analog switches, thus enabling a higher density ICed analog switch circuit. Further, since all the analog switches can be activated simultaneously, it is possible to reduce switching noise generated due to mutual interference between two analog switches.

Figure 4:
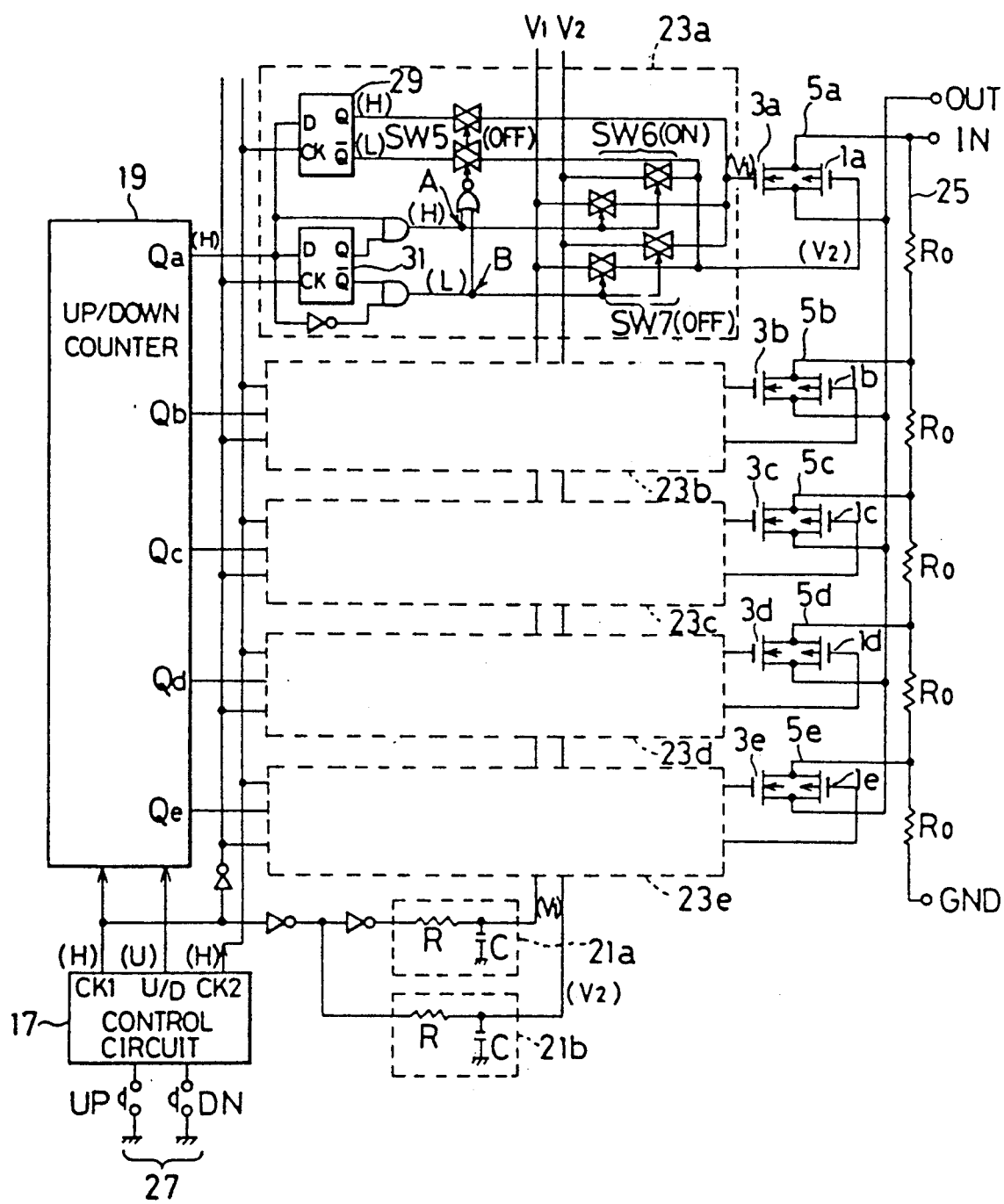
FIG. 4 is a circuit diagram showing a second embodiment of the analog switch circuit according to the present invention.

FIG. 4 shows a second embodiment of the present invention, which also includes only two integrating circuits and a number of analog switches so as to be applicable to an electronic variable resistor circuit.

The analog switch circuit shown in FIG. 4 comprises a control circuit 17, an up/down keys 27, an up/down counter 19, two integrating circuits 21a and 21b, a number of detecting circuits 23, a series-connected resistor 25, and a number of analog switches 5.

The control circuit 17 is connected to the up/down counter 19, the detecting circuits 23a to 23e and the integrating circuits 21a and 21b. That is, whenever the up/down key 27 is depressed, a first clock signal CK1 is applied to the up/down counter 19 and the two integrating circuits 21a and 21b; a second clock signal CK2 is applied to the detecting circuits 23a to 23e; and an up/down signal U/D is applied to the up/down counter 19.

Each output terminal Qa to Qe of the up/down counter 19 is connected to each detecting circuit 23a to 23e. When the up key 27 (UP) is depressed, an up signal is applied to the up/down counter 19, so that an output signal for instance is applied from the output terminals Qa to Qe to the detecting circuits 23a to 23e sequentially beginning from the terminal Qa whenever the first clock signal CK1 is given to the up/down counter 19. In contrast with this, when the down key 27 (DN) is depressed, a down signal is applied to the up/down counter 19, so that an output signal is applied from the output terminals Qa to Qe to the detecting circuits 23a to 23e sequentially beginning from the terminal Qe whenever the first clock signal CK1 is given to the up/down counter 19.

Each of the integrating circuits 21a and 21b is made up of a resistor R and a capacitor C. The integrating circuit 21a integrates the first clock signal CK1 and outputs a first switching signal $V_1$ with a gentle leading edge as shown in FIG. 3 to the detecting circuits 23a to 23e. The integrating circuit 21b integrates an inversion signal of the first clock signal $K_1$ and outputs a second switching signal $V_2$ with a gentle trailing edge as shown in FIG. 3 to the detecting circuits 23a to 23e.

A number of detecting circuits 23 control the switching operation of the analog switches 5a to 5e on the basis of the output signal from the up/down counter 19.

Each detecting circuit 23 comprises two D-latch flip-flops 29 and 31 and three two-way switches SW5, SW6, and SW7. The switches SW6 and SW7 selectively supply two output voltages $V_1$ and $V_2$ from the integrating circuits 21a and 21b to the PFET 1a and NFET 3a, respectively.

The flip-flop circuit 29 serves to hold a switched status of the analog switch 5a by supplying the two signals from the outputs Q and $\overline{Q}$ to the gate terminals of the PFET 1a and the NFET 3a via the switch SW5. On the other hand, the flip-flop circuit 31 controls the operations of the switches SW5 to SW7 on the basis of a signal from the output Qa and the first clock signal CK1.

Therefore, when the five analog switches 5a to 5e are turned on in sequence alternately, an input signal applied to the input terminal IN is divided in sequence by a plurality of ladder resistors 25 (connected in series between the input terminal IN and the ground terminal GND) and simultaneously outputted from the output terminal OUT. In more detail, when the analog switch 5a is turned on, the resistance between two terminals IN and OUT is zero; when the analog switch 5a is turned off and the analog switch 5b is turned on, the resistance is Ro; when the analog switches 5a and 5b are turned off and the analog switch 5c is turned on, the resistance is 2Ro; and so on, thus realizing a variable resistor operation in stepped fashion in response to the depression of up key.

Figure 5:
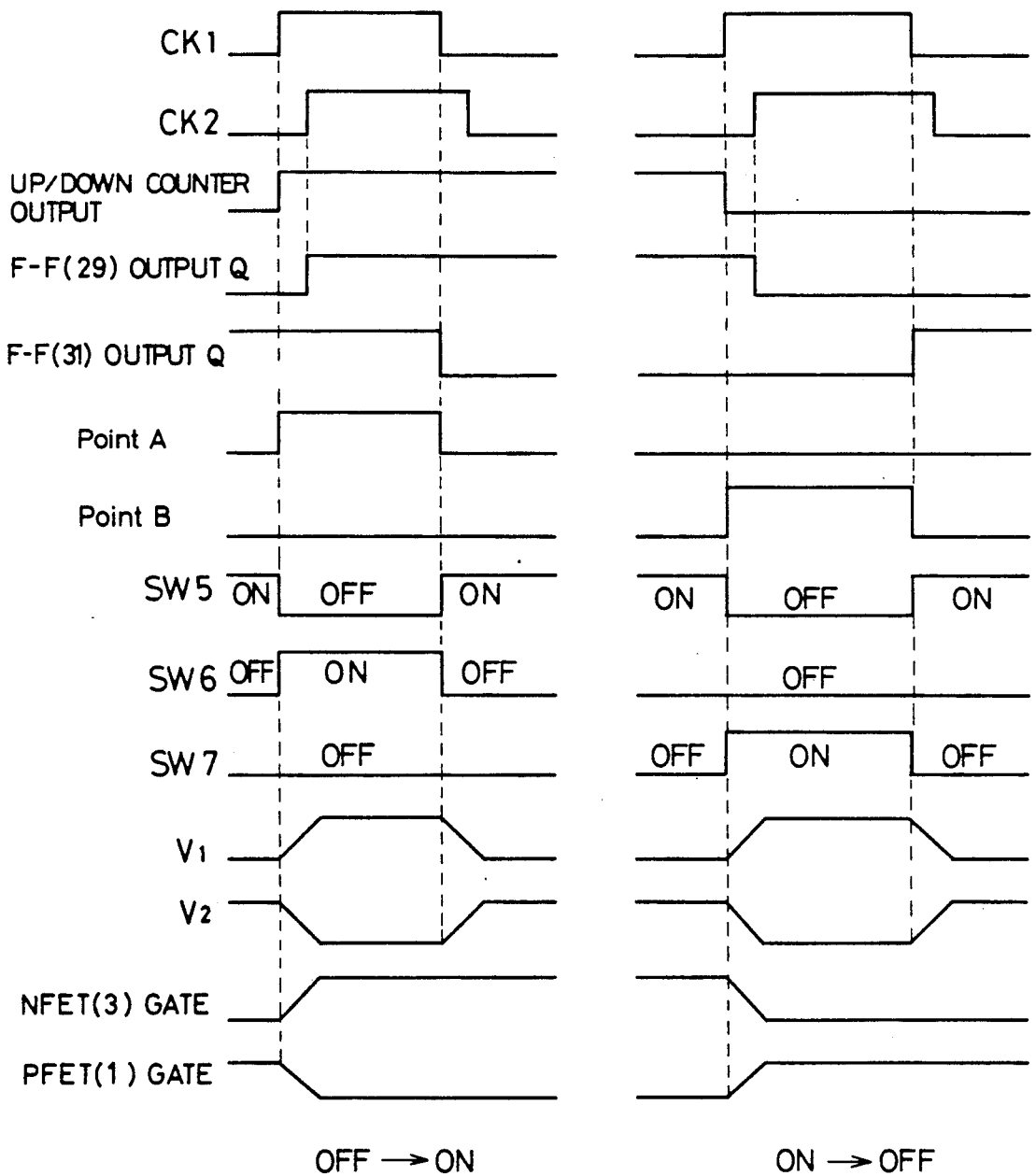
FIG. 5 is timing charts for assistance in explaining the operation of the analog switch circuit shown in FIG. 4.

The operation of the second embodiment shown in FIG. 4 will be described with reference to timing charts shown in FIG. 5.

(a) When analog switch 5a is turned on:

When the analog switch 5a is kept off, a low-voltage level signal is supplied from the output Q of the flip-flop circuit 29 to the gate terminal of the NFET 3a via the switch SW5, and a high-voltage level signal is supplied from the output $\overline{Q}$ of the flip-flop circuit 29 to the gate terminal of the PFET 1a via the same switch SW5.

Under these conditions, when a high-voltage level clock signal CK1 and an up signal UP (for allowing the up/down counter 19 to output high-level signals from the output terminals beginning from Qa to Qe sequentially) are given from the control circuit 17 to the up/down counter 19, a high-voltage level signal is outputted from the output terminal Qa of the up/down counter 19 to the flip-flop 31, so that the Q output thereof is latched at a high level and the Q output thereof is latched at a low level. Therefore, the potential at point A changes to a high level via an AND gate to turn off the switch SW5 via a NOR gate and to directly turn on the switch SW6.

In addition, the first clock signal CK1 is given to the integrating circuit 21a and the inverted clock signal thereof is given to the integrating circuit 21b. Therefore, an output voltage signal $V_1$ as shown in FIG. 5 is outputted from the integrating circuit 21a and an output voltage signal V₂ as shown in FIG. 5 is also outputted from the integrating circuit 21b.

The output voltage $V_1$ is given to the gate terminal of NFET 3a via the turned-on switch SW6, and the output voltage $V_2$ is given to the gate terminal of PFET 1a via the same switch SW6, so that the PFET 1a and the NFET 3a are both turned on at a relatively low speed. Under these conditions, an input signal applied to the input terminal IN is directly transmitted from the output terminal OUT through the turned-on analog switch 5a.

Further, immediately after the first clock signal CK1 has changed to a high level, the second clock signal CK2 also changes to a high level and applied to the clock terminal CK of the flip-flop 29, so that the output Q of the flip-flop 29 is switched to a high level and the output $\overline{Q}$ thereof is switched to a low level.

On the other hand, when the first clock signal CK1 changes to a low level, an inverted high level signal is applied to the clock terminal CK of the flip-flop circuit 31, so that the output Q of the flip-flop circuit 31 changes to a low level and thereby the potential at point A drops to a low level via an AND gate. As a result, the switch SW5 is turned on and the switch SW6 is turned off. A high-level signal is supplied from the output Q of the flip-flop circuit 29 to the gate terminal of the NFET 3a and simultaneously a low-level signal is supplied from the output $\overline{Q}$ thereof to the gate terminal of the PFET 1a, so that the analog switch 5a is kept turned on as it is.

(b) When analog switch 5a is turned off:

When a high level clock signal CK1 is again applied to the up/down counter 19 under the condition that the analog switch 5a is on, the output Qa of the up/down counter 19 changes to a low level and that Qb thereof changes to a high level. Therefore, the potential at point B changes to a high level, so that the switch SW5 is turned off and the switch SW7 is turned on.

The output voltage $V_1$ is supplied to the gate terminal of the PFET 1a via the switch SW7 and the output voltage $V_2$ is supplied to the gate terminal of the NFET 3a via the switch SW7, so that both the PFET 1a and the NFET 3a are turned off at relatively low speed.

Further, immediately after the clock signal CK1 has changed to a high level, when the clock signal CK2 changes to a high level, the output Q of the flip-flop circuit 29 changes to a low level and the output $\overline{Q}$ thereof changed to a high level.

Thereafter, when the clock signal CK1 changes to a low level, the output Q of the flip-flop circuit 31 changes to a high level, so that the potential at point B changes to a low level.

Therefore, the switch SW5 is turned on via the NOR gate and the switch SW7 is directly turned off, so that a low-level signal is supplied from the output Q of the flip-flop circuit 29 to the gate terminal of the NFET 3a and a high-level signal is supplied from the output $\overline{Q}$ thereof to the gate terminal of the PFET 1a to turn off the analog switch 5a.

Simultaneously when the analog switch 5a is turned off, the analog switch 5b is turned on. Therefore, an input signal applied to the input terminal N is transmitted from the output terminal OUT through the resistor Ro.

As described above, a number of output signals obtained by sequentially dividing an input signal by the ladder resistors 25 can be outputted from the output terminal OUT, whenever the analog switches are switched on or off in sequence.

In the above second embodiment, five analog switches 5a to 5e are incorporated in the analog switch circuit. However, it is of course possible to increase the number of analog switches without increasing the number (two) of the integrating circuits.

As described above, in the analog switch circuit according to the present invention, a first switching signal having a gentle leading edge generated from the first signal integrating circuit and a second switching signal having a gentle trailing edge generated from the second signal integrating circuit are selectively supplied to a plurality of analog switches for switching operation. Since the numbers of resistors and capacitors can be reduced down to two, it is possible to form the analog switch circuit into an IC. Further, there exist other advantages such that dispersion in time constant of the integrating circuits (due to dispersion in resistor and capacitor values) can be reduced and thus switching noise can further be prevented from being generated.

What is claimed is:

1. An analog switch circuit comprising:
   a plurality of analog switching elements for transmitting signals;
   first integrator for providing an integrated turn-on switching signal to turn on the plurality of analog switching elements at a speed slow enough to avoid the generation of switching noise;
   second integrator for providing an integrated turn-off switching signal to turn off the plurality of analog switching elements at a speed slow enough to avoid the generation of switching noise;
   a plurality of switches connected between the plurality of analog switching elements and the two integrators; and
   a controller selectively providing to the first and second integrators control signal to activate the turn-on and turn-off switching signals, the controller also providing control signals to the plurality of switches so that the turn-on or turn-off switching signals are selectively applied to the plurality of analog switching elements, the controller thereafter supplying signals to the plurality of analog switching elements via the switches to hold the plurality of analog switching elements in their selected states.

2. An analog switching circuit comprising:
   a plurality of analog switches, each formed of a pair of first and second parallel connected semiconductor switching elements, for transmitting signals;
   a first integrator providing a first integrated switching signal to turn on the second semiconductor switching elements and turn off the first semiconductor switching elements, at speeds low enough to prevent the generation of switching noise;
   a second integrator providing a second integrated switching signal to turn off the plurality of second semiconductor switching elements and turn on the plurality of first semiconductor switching elements, at speeds low enough to prevent the generation of switching noise;
   a plurality of pairs of switches, the pairs of switches being connected, respectively, between each pair of first and second parallel-connected semiconductor switching elements and said two integrators; and a control circuit for activating the first and second integrators and the plurality of pairs of switches so that the first and second integrated signal are selectively applied to each pair of first and second parallel-connected semiconductor switching elements through one of the plurality of the switches to simultaneously turn on or off the first and second parallel-connected semiconductor switching elements, the controller further generating a turn-on or turn-off signal selectively to each of the analog switches to hold each pair of switching elements in their selected state.

3. The analog switch circuit as set forth in claim 2, wherein each pair of parallel-connected first and second semiconductor elements are P-channel and N-channel field effect transistors, respectively.

4. The analog switching circuit as set forth in claim 2, wherein the first and second integrators each include a resistor and a capacitor.

5. An electronic variable resistor comprising:
a plurality of series connected resistors connected between an input terminal and a ground terminal;
a plurality of analog switches, one terminal of each switch being connected to the output terminal and the other terminal thereof being connected to the input terminal via a predetermined number of the series connected resistors, each analog switch formed of a pair of parallel-connected N and P-type semiconductor switching elements;
a control circuit for generating first and second clock signals, and also generating up/down signals to increase or decrease the resistance value of the variable resistor in response to an increment or decrement signal;
a first integrator for providing a first switching signal responding to the first clock signal at a speed slow enough to avoid the generation of switching noise;
a second integrator for providing a second switching signal responding to the inverted first clock signal at a speed slow enough to avoid the generation of switching noise;
an up/down counter for generating a plurality of counter output signals in sequence in response to the first clock signal in increment and decrement directions according to the increment and decrement signals;
a plurality of sets of two switches, each set being connected between the gate terminals of a respective pair of N and P type semiconductor switching elements and the two integrators;
a plurality of holding switches, each connected to the gate terminals of a respective pair of N and P-type switching elements;
a plurality of first D-latch flip-flops for selectively activating or deactivating the plurality of sets of two switches in response to one of the counter output signals and the first clock signal to selectively apply the first and second integrated switching signals to the N and P-type semiconductor switching elements, to turn on or off selected ones of the plurality of analog switches; and
a second plurality of D-latch flip-flops each for supplying two holding signals in response to the counter output signals and to the second clock signal to the N and P-type switching elements via said pair of holding switches selectively activated by the first D-latch flip-flop.

* * * * *